United States Patent
Ding et al.

(10) Patent No.: US 10,627,943 B2
(45) Date of Patent: Apr. 21, 2020

(54) TOUCH PANEL, METHOD OF DRIVING TOUCH PANEL, AND TOUCH DEVICE

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Wei Liu, Beijing (CN); ChihJen Cheng, Beijing (CN); Yuzhen Guo, Beijing (CN); Pengpeng Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/144,343

(22) Filed: Sep. 27, 2018

(65) Prior Publication Data
US 2019/0243493 A1    Aug. 8, 2019

(30) Foreign Application Priority Data
Feb. 6, 2018 (CN) .......................... 2018 1 0116618

(51) Int. Cl.
| G06F 3/041 | (2006.01) |
| H01L 51/52 | (2006.01) |
| H01L 27/32 | (2006.01) |
| G02F 1/1333 | (2006.01) |

(52) U.S. Cl.
CPC .......... *G06F 3/0412* (2013.01); *G06F 3/0414* (2013.01); *G06F 3/0416* (2013.01); *H01L 27/323* (2013.01); *H01L 51/5237* (2013.01); *G02F 1/13338* (2013.01); *G06F 2203/04111* (2013.01)

(58) Field of Classification Search
CPC ... G06F 3/041–047; G06F 2203/04105–04106
See application file for complete search history.

(56) References Cited

U.S. PATENT DOCUMENTS

| 10,209,803 | B2 * | 2/2019 | Kim ..................... G02F 1/13338 |
| 2009/0002199 | A1 * | 1/2009 | Lainonen ............... G06F 3/0414 341/20 |
| 2015/0331517 | A1 * | 11/2015 | Filiz ..................... G06F 3/0414 345/173 |
| 2017/0199624 | A1 * | 7/2017 | Nathan .................. G06F 3/0414 |
| 2018/0081441 | A1 * | 3/2018 | Pedder .................... G06F 3/016 |
| 2018/0321778 | A1 * | 11/2018 | Lee ........................ G06F 3/0412 |

(Continued)

*Primary Examiner* — Gene W Lee
(74) *Attorney, Agent, or Firm* — Dilworth & Barrese, LLP.; Michael J. Musella, Esq.

(57) ABSTRACT

A touch panel, a method of driving a touch panel, and a touch device are provided. The touch panel includes a first detection electrode, a piezoelectric material layer and a position touch structure. The piezoelectric material layer is on the first detection electrode. The position touch structure comprises a touch electrode or a plurality of touch electrodes and is on the piezoelectric material layer. The touch electrode or at least one of the plurality of touch electrodes is configured to function as a second detection electrode as well, and the second detection electrode together with the piezoelectric material layer and the first detection electrode constitutes a piezoelectric sensing structure for implementing a touch pressure detection.

13 Claims, 7 Drawing Sheets

(56) References Cited

U.S. PATENT DOCUMENTS

| | | | |
|---|---|---|---|
| 2019/0004651 A1* | 1/2019 | Hong | G06F 3/0412 |
| 2019/0087046 A1* | 3/2019 | Guo | G06F 3/044 |
| 2019/0163314 A1* | 5/2019 | Kim | G06F 3/0416 |

* cited by examiner

TOUCH PANEL, METHOD OF DRIVING TOUCH PANEL, AND TOUCH DEVICE

CROSS-REFERENCE TO RELATED APPLICATIONS

The application claims priority to the Chinese patent application No. 201810116618.2, filed on Feb. 6, 2018, the entire disclosure of which is incorporated herein by reference as part of the present application.

TECHNICAL FIELD

Embodiments of the present disclosure relate to a touch panel, a method of driving a touch panel, and a touch device.

BACKGROUND

With development of technology, touch screens have become more and more widely used, and gradually become one kind of the most convenient human-computer interaction devices. In recent years, in order to further improve the experience of human-computer interaction, 3D touch (Force Touch) technology comes into being and obtains more and more attention and research.

SUMMARY

At least one embodiment of the present disclosure provides a touch panel, comprising: a first detection electrode; a piezoelectric material layer on the first detection electrode; and a position touch structure, comprising a touch electrode or a plurality of touch electrodes and on the piezoelectric material layer; wherein the touch electrode or at least one of the plurality of touch electrodes is configured to function as a second detection electrode as well, and the second detection electrode together with the piezoelectric material layer and the first detection electrode constitutes a piezoelectric sensing structure for implementing a touch pressure detection.

For example, in the touch panel provided by an embodiment of the present disclosure, a material of the piezoelectric material layer comprises a transparent piezoelectric material.

For example, in the touch panel provided by an embodiment of the present disclosure, the touch electrode or the at least one of the plurality of touch electrodes comprises at least one of a transparent conductive electrode or a grid-shaped metal electrode.

For example, in the touch panel provided by an embodiment of the present disclosure, the plurality of touch electrodes comprise a plurality of first touch electrodes and a plurality of second touch electrodes, the plurality of first touch electrodes are configured to form a touch scanning line extending in a first direction, and the plurality of second touch electrodes are configured to form a touch sensing line extending in a second direction intersecting with the first direction.

For example, in the touch panel provided by an embodiment of the present disclosure, the first touch electrodes and the second touch electrodes are in a same layer, the position touch structure further comprises a plurality of bridge connection portions, the bridge connection portions are in a different layer from the first touch electrodes and the second touch electrodes, the first touch electrodes or the second touch electrodes are connected in series through the bridge connection portions to form the touch scanning line or the touch sensing line, and the first touch electrodes and the second touch electrodes are closer to the piezoelectric material layer than the bridge connection portions.

For example, in the touch panel provided by an embodiment of the present disclosure, the first touch electrodes and the second touch electrodes are in different layers.

For example, in the touch panel provided by an embodiment of the present disclosure, the plurality of touch electrodes are insulated from each other and in a same layer, and the plurality of touch electrodes are configured to be electrically connected to touch signal lines, correspondingly, to transmit touch signals.

For example, the touch panel provided by an embodiment of the present disclosure further comprises a display structure, wherein the display structure is configured to perform a display operation according to electrical signals applied to the display structure, and the piezoelectric sensing structure is on the display structure.

For example, in the touch panel provided by an embodiment of the present disclosure, the display structure comprises an organic light emitting diode display array or a liquid crystal display array.

For example, in the touch panel provided by an embodiment of the present disclosure, the organic light emitting diode display array of the display structure comprises a common cathode, and the common cathode is configured to also function as the first detection electrode.

For example, in the touch panel provided by an embodiment of the present disclosure, the display structure further comprises a thin film encapsulation layer, the thin film encapsulation layer is on the common cathode, and the piezoelectric material layer is on the thin film encapsulation layer.

For example, the touch panel provided by an embodiment of the present disclosure further comprises a pressure detection circuit, wherein the pressure detection circuit is configured to collect a pressure detection signal between the first detection electrode and the second detection electrode by way of charge amplification when an enable signal is applied.

At least one embodiment of the present disclosure also provides a touch device, comprising the touch panel described above.

At least one embodiment of the present disclosure also provides a method of driving the touch panel described above, comprising a touch position detection phase and a touch pressure detection phase, wherein in the touch position detection phase, a touch scanning signal is applied to the touch electrode or the plurality of touch electrodes and a touch detection signal is collected, for implementing a position detection; and in the touch pressure detection phase, a pressure detection signal between the first detection electrode and the second detection electrode is collected for implementing a pressure detection.

For example, in the method of driving the touch panel described above provided by an embodiment of the present disclosure, in the touch pressure detection phase, that the pressure detection signal between the first detection electrode and the second detection electrode is collected for implementing the pressure detection comprises: the pressure detection signal is collected by way of charge amplification.

For example, in the method of driving the touch panel described above provided by an embodiment of the present disclosure, in the touch pressure detection phase, that the pressure detection signal between the first detection electrode and the second detection electrode is collected for implementing the pressure detection further comprises: the pressure detection signal is processed combining with the touch detection signal for implementing a multi-touch-pressure detection.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

Figure 1:
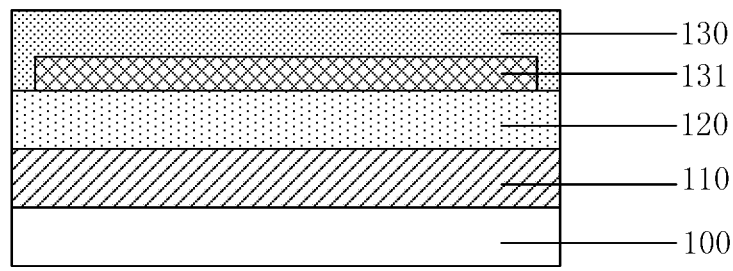
FIG. 1 is a schematic cross-sectional view of a touch panel provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

3D touch technology is realized by adding a pressure detection function based on a touch position detection function. For example, according to the deformation generated due to user's finger pressing on the surface of a touch panel, the magnitude of pressure variation is sensed by a piezoelectric sensing structure, thereby implementing touch pressure detection. This technology can not only detect the touch position on the two-dimensional plane, but also detect the external pressure applied upon the touch panel, thereby realizing the touch detection in all the three dimensions. When performing the touch pressure detection, different levels of feedback signals are outputted by determining whether pressure exists or not or determining the magnitude of the pressure, so as to provide diversified touch functions. 3D touch technology may be applied to various electronic devices, and can be combined with display technology, thereby providing products with plentiful functions and good user experience.

However, the above-mentioned 3D touch technology is realized by adding additional components to a position touch structure, for example, adding a piezoelectric sensing structure, and the piezoelectric sensing structure and the position touch structure are mutually independent. This method leads to the increase in the thickness of the panel, a more complicated manufacturing process, and a higher production cost. In addition, because pressure detection signal and touch detection signal are two independent kinds of signals, they may easily interfere with each other, thereby reducing the detection accuracy.

At least one embodiment of the present disclosure provides a touch panel, a method of driving the touch panel, and a touch device. By enabling touch electrode(s) to function as a detection electrode for pressure detection, the integration level of the touch panel is improved, the thickness of the panel is not increased with more functions, the manufacturing process is simple, the production cost is low, and the detection accuracy is high.

The embodiments of the present disclosure are described in detail below with reference to the accompanying drawings. It should be noted that the same reference symbols in different drawings are used to represent the same elements that has been described.

At least one embodiment of the present disclosure provides a touch panel, which comprises a first detection electrode, a piezoelectric material layer and a position touch structure. The piezoelectric material layer is on the first detection electrode. The position touch structure comprises a touch electrode or a plurality of touch electrodes and is on the piezoelectric material layer. The touch electrode or at least one of the plurality of touch electrodes is configured to function as a second detection electrode as well, and the second detection electrode together with the piezoelectric material layer and the first detection electrode constitutes a piezoelectric sensing structure for implementing a touch pressure detection function. The touch panel can perform a touch position detection as well as a touch pressure detection, so as to realize 3D touch. By enabling the touch electrode(s) to function as the detection electrode for pressure detection, the integration level of the touch panel is improved, the thickness of the panel is not increased with the combined functions, the manufacturing process is simple, the production cost is low, and the detection accuracy is high.

FIG. 1 is a schematic cross-sectional view of a touch panel provided by an embodiment of the present disclosure. Referring to FIG. 1, the touch panel comprises a substrate 100, a first detection electrode 110, a piezoelectric material layer 120 and a position touch structure 130.

The substrate 100 serves as a carrier for functions of support, protection, and the like, and may be a glass substrate, a plastic substrate, or the like. The first detection electrode 110 is provided on the substrate 100. The first detection electrode 110 may be formed by adopting a transparent conductive material such as indium tin oxide (ITO) or indium zinc oxide (IZO), or adopting a metal material such as aluminum, aluminum alloy, copper, copper alloy, or the like, which is not limited in the embodiments of the present disclosure. The piezoelectric material layer 120 is on the first detection electrode 110. The piezoelectric material layer 120 may be formed by adopting a transparent piezoelectric material such as an inorganic or organic piezoelectric material, e.g., polyvinylidene fluoride (PVDF), or adopt other piezoelectric film or other suitable piezoelectric material.

The position touch structure 130 is on the piezoelectric material layer 120 for implementing a touch position detection function. The position touch structure 130 may be, for example, a resistance-type touch structure or a capacitive type touch structure. The capacitive type touch structure may be a projected capacitive touch structure of a self-capacitive type or a mutual capacitive type. For example, the position touch structure 130 comprises a touch electrode or a plurality of touch electrodes 131, and the touch electrode or the plurality of touch electrodes 131 is on the piezoelectric material layer 120. The position touch structure 130 may comprise one or more touch electrodes 131 according to the specific structure, which is not limited in the embodiment of the present disclosure. For example, the position touch structure 130 may be a resistance-type touch structure or a surface capacitive touch structure, and comprises a touch electrode corresponding to the entire working area of the touch panel, and the touch electrode is multiplexed or reused for different functions. For another example, the position touch structure 130 may be a projected capacitive touch structure, and comprises a plurality of touch electrodes, as a whole corresponding to the entire working area of the touch panel, and at least one of the touch electrodes is multiplexed or reused for different functions.

The touch electrode or the plurality of touch electrodes 131 may adopt a transparent conductive material, or adopt a metal or other suitable material. The touch electrode or at least one of the touch electrodes 131 is not only used for a touch position detection but also configured to function as a second detection electrode by way of time division multiplexing, and cooperates with the first detection electrode 110 and the piezoelectric material layer 120 to constitute a piezoelectric sensing structure, so as to implement a touch pressure detection function, for example, detecting the presence or absence of pressure and/or the magnitude of the pressure. For example, in an example, a touch detection signal for the touch position detection and a pressure detection signal for the touch pressure detection are transmitted through a same transmission channel (e.g., using a multiplexing circuit) in a time division way, thereby avoiding the mutual interference of the signals and having a higher detection accuracy.

The touch electrode 131, the first detection electrode 110, and the piezoelectric material layer 120 constitute a sandwich-type piezoelectric sensing structure. Certainly, the embodiments of the present disclosure are not limited thereto, and the piezoelectric sensing structure may also be a multilayered piezoelectric film and/or a multipiece piezoelectric film (for example, a two-layer and two-piece piezoelectric film) or any other type of piezoelectric sensing structure.

As described above, in different embodiments or examples, there may be provided one or more the touch electrodes 131. In a case where there is only one touch electrode 131, the touch electrode 131 is configured to function as the second detection electrode. In a case where there are a plurality of touch electrodes 131, part or all of the touch electrodes 131 are configured to function as the second detection electrode. For example, in an example, there are a plurality of touch electrodes 131, and part of the touch electrodes 131 are configured to function as the second detection electrode, so as to avoid the waste of driving resources while realizing the touch pressure detection. For example, in another example, there are a plurality of touch electrodes 131, and all the touch electrodes 131 are configured to function as the second detection electrode, so as to expand the effective range of the touch pressure detection or provide the detection of higher position accuracy, thereby providing a better user experience.

The touch electrode 131 and the piezoelectric material layer 120 may be in direct or indirect contact with each other, and the embodiments of the present disclosure are not limited thereto. For example, in an example, the touch electrode 131 is in direct contact with the piezoelectric material layer 120, which is advantageous for enhancing the strength of the coupled signal and facilitating signal detection. For example, in another example, the touch electrode 131 is in indirect contact with the piezoelectric material layer 120 (for example, an insulating layer is between the touch electrode 131 and the piezoelectric material layer 120) to facilitate the combination with various kinds of position touch structures 130.

Materials used for the touch electrode 131, the first detection electrode 110, and the piezoelectric material layer 120 are not related to each other, and may be selected from suitable materials, respectively, or may cooperate with each other to expand functions. For example, in an example, the touch electrode 131, the first detection electrode 110, and the piezoelectric material layer 120 are all transparent materials to facilitate combination with other structures (e.g., display structure). For example, in another example, at least part of the touch electrode 131 and the first detection electrode 110 is made of a metal material to reduce conduction resistance and improve signal quality.

It should be noted that, in the embodiments of the present disclosure, the touch panel may comprise more or fewer structures, and the relative positional relationship of each structure is not limited, which may be determined according to actual needs.

Figure 2:
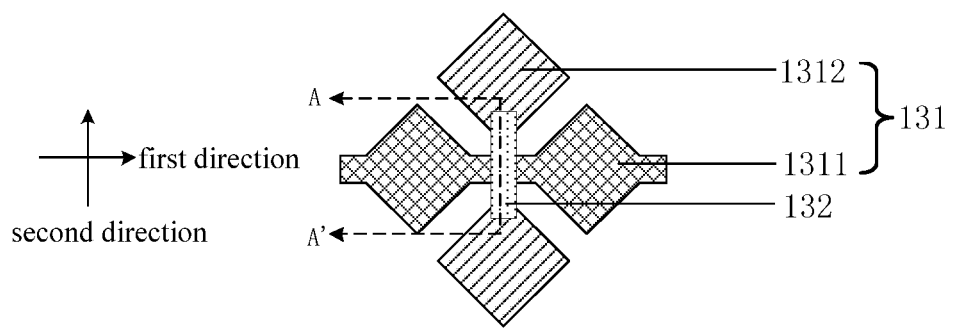
FIG. 2 is a schematic plan view of touch electrodes of a touch panel provided by an embodiment of the present disclosure.

FIG. 2 is a schematic plan view of touch electrodes of a touch panel provided by an embodiment of the present disclosure. The position touch structure 130 of the touch panel is a capacitive type touch structure. Referring to FIG. 2, the touch structure is a mutual capacitive type touch structure, that is, the touch electrodes 131 are used in a mutual capacitive sensing mode, and comprise a plurality of first touch electrodes 1311 and a plurality of second touch electrodes 1312 which are insulated from the first touch electrodes 1311. For example, the first touch electrodes 1311 are configured to form a touch scanning line to transmit a touch scanning signal. The second touch electrodes 1312 are configured to form a touch sensing line to transmit a touch detection signal. The touch scanning line and the touch sensing line are respectively connected to a touch driving circuit such as a touch driving chip, through leads, which are formed in, for example, a peripheral area of the touch panel. The first touch electrodes 1311 extend in a first direction (lateral direction in the drawing), and the second touch electrodes 1312 extend in a second direction (longitudinal direction in the drawing) intersecting with the first direction. For example, the first direction and the second direction are perpendicular to each other, that is, the angle between the first direction and the second direction is 90 degrees. Certainly, the embodiment of the present disclosure is not limited thereto, the first direction and the second direction may be any directions, and the angle between the first direction and the second direction may be any values. Projected capacitances are generated between the first touch electrodes 1311 and the second touch electrodes 1312. When the finger of a user touches the panel, the capacitance value at the touch position changes, so that the touch position can be detected according to the change of the capacitance value.

For example, the position touch structure 130 (not illustrated in FIG. 2) further comprises a plurality of bridge connection portions 132. The first touch electrodes 1311 and the second touch electrodes 1312 are in a same layer, and the bridge connection portions 132 are in a different layer from the first touch electrodes 1311 and the second touch electrodes 1312. A plurality of second touch electrodes 1312 adjacent in a same column are connected in series through the bridge connection portions 132 to form the touch sensing line extending in the second direction, and a plurality of first touch electrodes 1311 adjacent in a same row are connected through connection portions integrally formed with the first touch electrodes 1311 to form the touch scanning line extending in the first direction. By using the bridge connection portions 132, the touch sensing line can cross over the touch scanning line that intersects therewith, and the touch sensing line and the touch scanning line are insulated from each other. It should be noted that, in the embodiments of the present disclosure, the structural forms of the first touch electrodes 1311 and the second touch electrodes 1312 are not limited. For example, the plurality of first touch electrodes 1311 may also be connected in series through the bridge connection portions 132 to form the touch scanning line, and the plurality of second touch electrodes 1312 are connected through connection portions integrally formed with the second touch electrodes 1312 to form the touch sensing line.

The bridge connection portions 132 may be omitted as appropriate. For example, in other examples, the first touch electrodes 1311 and the second touch electrodes 1312 are in different layers, so that the touch scanning line and the touch sensing line can be formed without the bridge connection portions 132. In this way, the manufacturing process is simple and it is easy to be realized. The bridge connection portions 132 may adopt a transparent conductive material, a metal or other suitable material.

Figure 3:
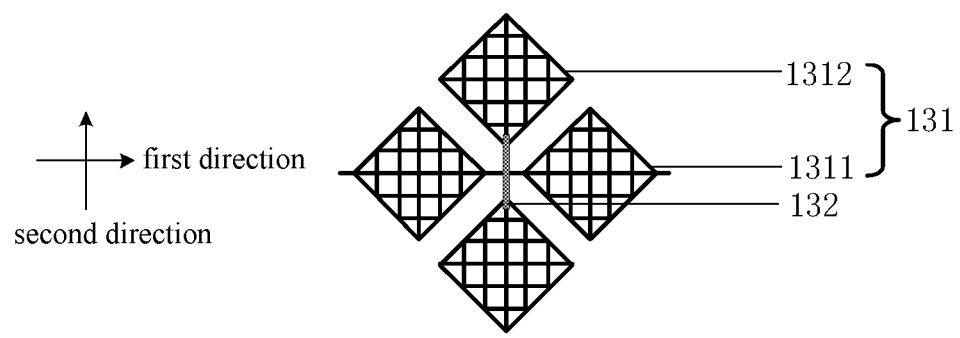
FIG. 3 is a schematic plan view of touch electrodes of another touch panel provided by an embodiment of the present disclosure.

The shape of the first touch electrodes 1311 and the shape of the second touch electrodes 1312 are not limited to the diamond shape as illustrated in FIG. 2, and may be any shape such as a rectangle, a triangle, a circle, or the like. The touch electrodes 131 may be plate-like structure formed of a transparent conductive material, which can increase the area of the electrode for generating the projected capacitance, thereby increasing the capacitance value, facilitating signal detection, and facilitating combination with a display structure. Certainly, the touch electrodes 131 may also be grid-shaped metal electrode, that is, have a hollow structure, which can reduce the resistance and improve the detection accuracy. For example, FIG. 3 is a schematic plan view of touch electrodes of another touch panel provided by an embodiment of the present disclosure. Referring to FIG. 3, the first touch electrodes 1311 and the second touch electrodes 1312 are designed by using a grid, for example, formed by grid-shaped metal leads or wires, and a hollow structure is formed between the metal leads. The second touch electrodes 1312 are electrically connected through the bridge connection portions 132, and the first touch electrodes 1311 are electrically connected through metal leads integrally formed therewith. For example, in an embodiment involving a touch display device, the touch panel further comprises a display structure. In a case where the touch electrodes 131 are metal grids, the metal leads are disposed in a non-display area to avoid affecting the display quality.

Figure 4:
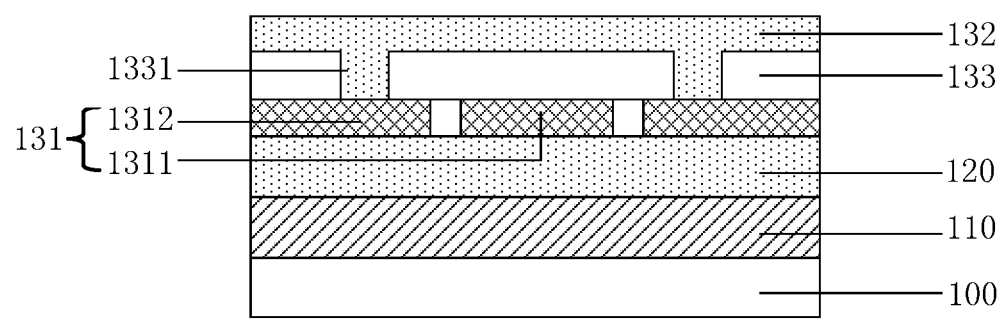
FIG. 4 is a schematic cross-sectional view of a touch panel provided by an embodiment of the present disclosure.

FIG. 4 is a schematic cross-sectional view of a touch panel provided by an embodiment of the present disclosure, corresponding to the position of the line A-A' in FIG. 2. Referring to FIG. 4, the touch electrodes 131 and the bridge connection portions 132 of the touch panel are the structures described in FIG. 2, and the substrate 100, the first detection electrode 110 and the piezoelectric material layer 120 are substantially the same as the structures described in FIG. 1.

In this embodiment, the touch electrodes 131 (for example, the first touch electrodes 1311 and the second touch electrodes 1312) are provided on the piezoelectric material layer 120, configured to function as the second detection electrode in a way of time division, and cooperate with the first detection electrode 110 and the piezoelectric material layer 120 to constitute a piezoelectric sensing structure, thereby implementing a touch pressure detection function. An insulating layer 133 is provided on the touch electrodes 131. The bridge connection portions 132 are on the insulating layer 133, and are electrically connected to the second touch electrodes 1312 through via holes 1331 formed in the insulating layer 133. The touch electrodes 131 are closer to the piezoelectric material layer 120 than the bridge connection portions 132, and in this way, the strength of the coupled signal can be enhanced to facilitate signal detection. Certainly, the embodiments of the present disclosure are not limited thereto, and the touch electrodes 131 may also be further away from the piezoelectric material layer 120 than the bridge connection portions 132. For example, in other examples, the bridge connection portions 132 are on the piezoelectric material layer 120, the insulating layer 133 is on the bridge connection portions 132, and the touch electrodes 131 are on the insulating layer 133. In this way, the distance between the touch electrodes 131 and the finger in the touch operation is smaller, which is beneficial to improving the detection accuracy of the touch position.

The insulating layer 133 is configured to isolate the touch electrodes 131 and the bridge connection portions 132, for the functions of insulation, protection, and the like. For example, the bridge connection portions 132 are electrically connected to part of the touch electrodes 131 (e.g., the second touch electrodes 1312) through the via holes 1331 in the insulating layer 133 to form the touch scanning line or the touch sensing line, and the insulating layer 133 can ensure that the bridge connection portions 132 and another part of the touch electrodes 131 (e.g., the first touch electrodes 1311) are insulated from each other. Certainly, the embodiments of the present disclosure are not limited thereto, the bridge connection portions 132 may be electrically connected to the first touch electrodes 1311 through other via holes, and the insulating layer 133 is configured to ensure that the bridge connection portions 132 and the second touch electrodes 1312 are insulated from each other. The insulating layer 133 may be formed by adopting silicon nitride, silicon oxide or other suitable material. The insulating layer 133 may be a single layer or a multilayered structure of several materials, which is not limited in the embodiment of the present disclosure.

Figure 5:
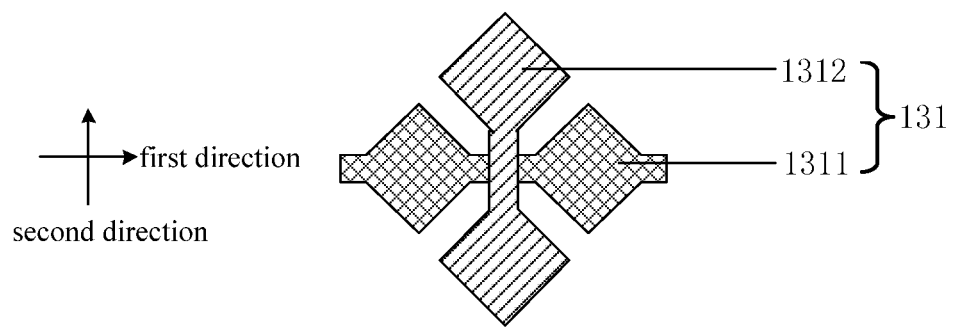
FIG. 5 is a schematic plan view of touch electrodes of a touch panel provided by an embodiment of the present disclosure.
Figure 6:
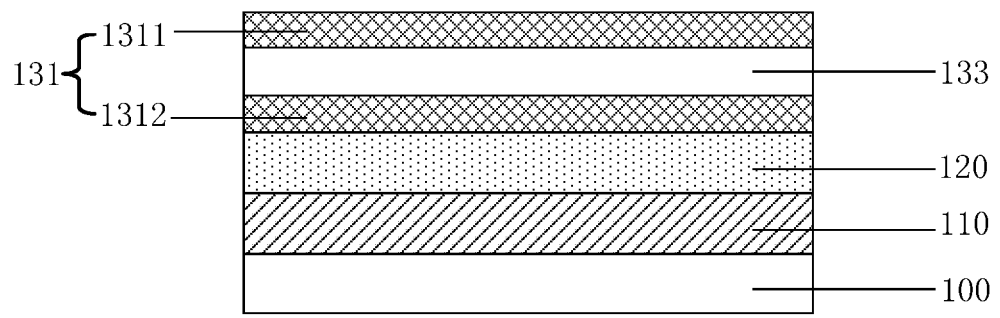
FIG. 6 is a schematic cross-sectional view of a touch panel provided by an embodiment of the present disclosure.

In another example, as illustrated in FIGS. 5 and 6, the difference from the cases as illustrated in FIGS. 2, 3 and 4 is that, the position touch structure 130 comprises the touch electrodes 131, and the first touch electrodes 1311 of the touch electrodes 131 and the second touch electrodes 1312 of the touch electrodes 131 are in different layers and are spaced apart from each other by the insulating layer 133, so that the two can cross each other without the bridge connection portions 132. In this example, as in the cases as illustrated in FIGS. 2, 3 and 4, the first touch electrodes 1311 and the second touch electrodes 1312 may also be in various suitable shapes or may adopt a grid design or the like. And the arrangement manner of the first detection electrode 110 and the piezoelectric material layer 120 is also similar, which is not described again in details here. The first touch electrodes 1311 may be above the second touch electrodes 1312 or may be under the second touch electrodes 1312, which is not limited in the embodiments of the present disclosure. The first touch electrodes 1311 may be configured to form the touch scanning line or the touch sensing line, and accordingly, the second touch electrodes 1312 may be configured to form the touch sensing line or the touch scanning line, which is not limited in the embodiments of the present disclosure.

Figure 7:
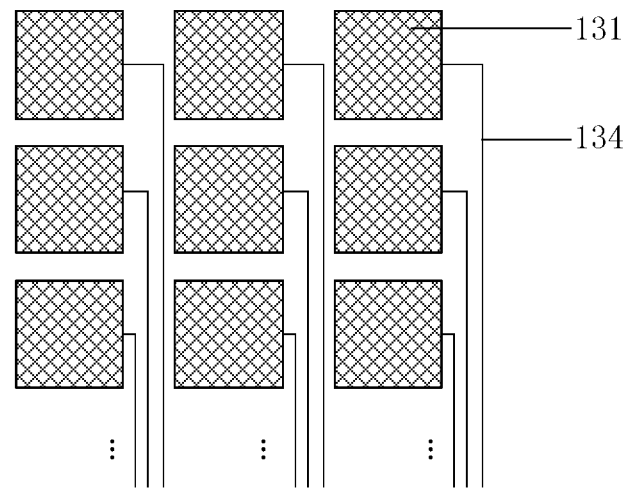
FIG. 7 is a schematic plan view of touch electrodes of a touch panel provided by an embodiment of the present disclosure.

FIG. 7 is a schematic plan view of touch electrodes of a touch panel provided by an embodiment of the present disclosure. Referring to FIG. 7, the touch structure is a self-capacitive type touch structure, that is, the plurality of touch electrodes 131 are used in a self-capacitive sensing mode, for example, insulated from each other and arranged in a matrix. The plurality of touch electrodes 131 are in a same layer or in different layers. Each of the touch electrodes 131 is configured to be electrically connected to a corresponding touch signal line 134 to transmit a touch signal. The touch electrodes 131 may have a square shape, or may have any other shape such as a rectangle, a circle, a hexagon, a triangle, or the like. The arrangement of the touch electrodes 131 is not limited and may be determined according to actual needs. The size of each of the touch electrodes 131 is not limited. For example, in an example, the size of each of the touch electrodes 131 is 5 mm*5 mm, so as to meet the requirement of the detection accuracy for the touch of a normal finger, and reduce the number of the touch electrodes 131 as much as possible.

The touch electrodes 131 and the corresponding touch signal lines 134 may be in a same layer or in different layers. For example, in an example, the touch electrodes 131 and the touch signal lines 134 are in a same layer, and the touch signal lines 134 are located between the adjacent touch electrodes 131, thereby simplifying the manufacturing process and reducing the production cost. For example, in another example, the touch electrodes 131 and the touch signal lines 134 are in different layers, and the touch electrodes 131 cover the touch signal lines 134 and are electrically connected through via holes, thereby reducing the distance between the adjacent touch electrodes 131 and avoiding touch blind zones.

Figure 8:
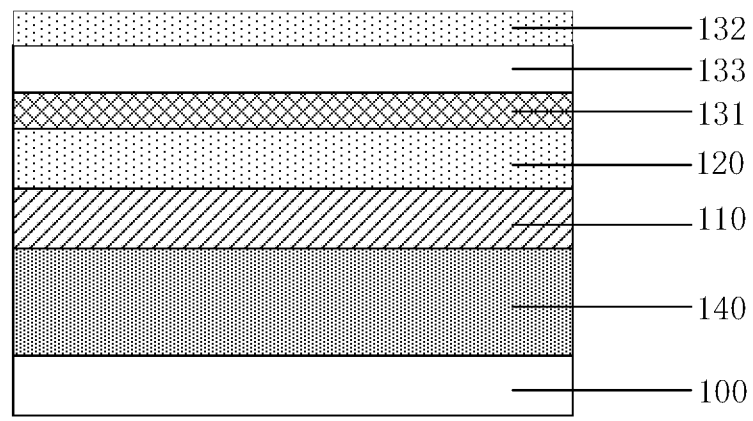
FIG. 8 is a schematic cross-sectional view of a touch panel provided by an embodiment of the present disclosure.

FIG. 8 is a schematic cross-sectional view of a touch panel provided by an embodiment of the present disclosure. Referring to FIG. 8, in addition that a display structure 140 is further comprised, the touch panel of this embodiment is substantially the same as the touch panel described in FIG. 4 (the specific structure of the touch electrodes 131 and the insulating layer 133 is not illustrated in detail in the drawing). In this embodiment, the display structure 140 is on the substrate 100, and the display structure 140 is configured to perform a display operation according to electrical signals applied to the display structure 140, that is, to display according to obtained display data signals. The piezoelectric sensing structure formed by the first detection electrode 110, the piezoelectric material layer 120, and the touch electrode 131 is stacked on the display structure 140. Certainly, the embodiments of the present disclosure are not limited thereto, and the display structure 140 may be disposed at any position, which may be determined according to actual needs. The display structure 140 may comprise an organic light emitting diode display array, a liquid crystal display array, an electronic paper display array, and the like, which is not limited in the embodiment of the present disclosure.

Figure 9:
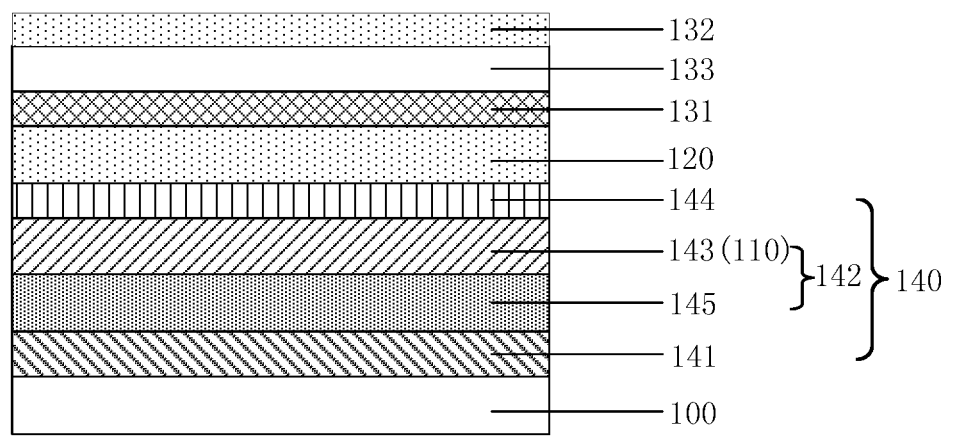
FIG. 9 is a schematic cross-sectional view of another touch panel provided by an embodiment of the present disclosure.

FIG. 9 is a schematic cross-sectional view of another touch panel provided by an embodiment of the present disclosure. Referring to FIG. 9, the touch panel of this embodiment is substantially the same as the touch panel described in FIG. 8, except for the specific structural form of the display structure 140 and the arrangement manner of the first detection electrode 110.

In this embodiment, the display structure 140 comprises a pixel circuit layer 141, an organic light emitting diode display array 142, and a thin film encapsulation layer 144. The pixel circuit layer 141 is formed on the substrate 100 for driving and controlling the organic light emitting diode display array 142 to emit light for display. The pixel circuit layer 141 may comprise, for example, a pixel circuit array corresponding to a sub-pixel array, and the pixel circuit may comprise a plurality of thin film transistors, field effect transistors or other devices (e.g., capacitors), and may be implemented in other suitable configuration. The organic light emitting diode display array 142 is provided on the pixel circuit layer 141, and comprises an organic light emitting layer 145 and a common cathode 143. The common cathode 143 is on the organic light emitting layer 145, and may be formed by adopting a transparent conductive material, a metal, or other suitable material. The thin film encapsulation layer 144 is on the common cathode 143, and the main functions comprise protection, insulation, and the like. The material of the thin film encapsulation layer 144 is not limited and may be an inorganic or organic film, or other suitable material. The piezoelectric material layer 120 is on the thin film encapsulation layer 144, that is, the thin film encapsulation layer 144 not only protects and insulates other components in the display structure 140, but also serves as a base for the piezoelectric material layer 120 and the touch electrodes 131 thereon for function of support, and may be manufactured, for example, by using an organic thin film material, the specific implementation of which is not limited in the embodiments of the present disclosure.

In this embodiment, the common cathode 143 not only works in cooperation with the organic light emitting layer 145 and the pixel circuit layer 141 for display, but also serves as the first detection electrode 110 by way of time division multiplexing, and cooperates with the piezoelectric material layer 120 and the touch electrodes 131 to constitute a piezoelectric sensing structure, thereby implementing a touch pressure detection function. In this way, the integration level of the touch panel can be further improved, the thickness of the panel is reduced, the manufacturing process is simple, and the production cost is low.

It should be noted that, in the embodiments of the present disclosure, the display structure 140 is not limited to the above-mentioned form or type, and may be of any form or type, and the display structure 140 may comprise more or few components, which is not limited in the embodiments of the present disclosure. The arrangement manner of the first detection electrode 110 is not limited, and the first detection electrode 110 may be obtained not only by multiplexing the common cathode 143 but also by multiplexing other components, which may be determined according to the specific configuration of the display structure 140.

Figure 10:
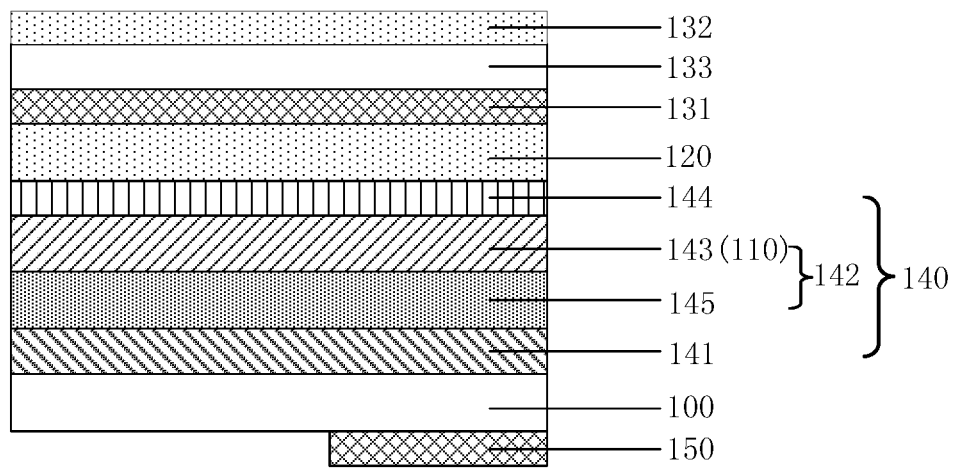
FIG. 10 is a schematic cross-sectional view of still another touch panel provided by an embodiment of the present disclosure.

FIG. 10 is a schematic cross-sectional view of still another touch panel provided by an embodiment of the present disclosure. Referring to FIG. 10, the touch panel of this embodiment is substantially the same as the touch panel described in FIG. 9, except that a pressure detection circuit 150 is further comprised. In this embodiment, the pressure detection circuit 150 is on a side of the substrate 100 remote from the display structure 140, for collecting a pressure detection signal of the piezoelectric sensing structure.

The pressure detection circuit 150 may operate in a manner of charge amplification, and may also operate in a manner of voltage amplification, or adopts other suitable manner. For example, in an example, the pressure detection circuit 150 is configured to collect a pressure detection signal between the first detection electrode 110 (i.e., the common cathode 143) and the second detection electrode (i.e., the touch electrodes 131) by way of charge amplification when an enable signal is turned on or applied.

For example, the pressure detection circuit 150 may be electrically connected to the common cathode 143 and the touch electrodes 131 through electrical wires, and the electrical wires may be disposed on the touch panel or disposed outside the touch panel. The position of the pressure detection circuit 150 is not limited in the embodiments of the present disclosure, and the pressure detection circuit 150 may be at any position of the touch panel, or may be outside the touch panel and be electrically connected to the common cathode 143 and the touch electrodes 131 through a flexible circuit board. The specific configuration of the pressure detection circuit 150 is not limited, and the pressure detection circuit 150 may be constituted by analog devices according to the circuit principles, and may also be constituted by a digital chip, or may be configured in other suitable manner.

Figure 11:
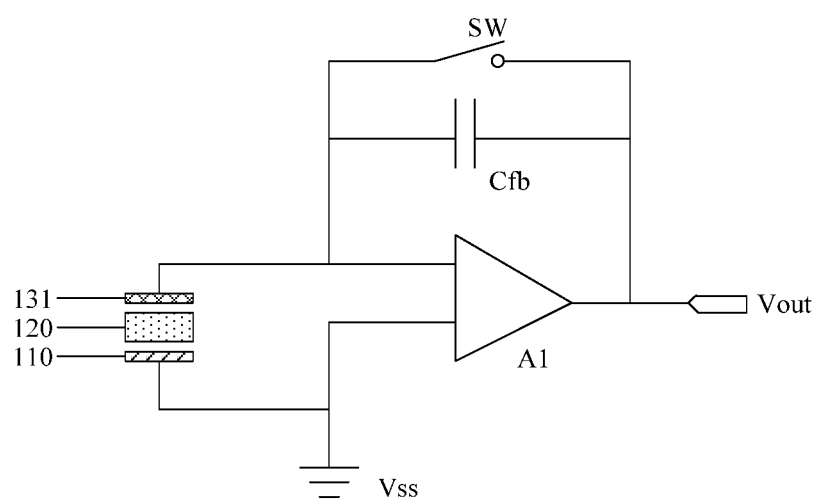
FIG. 11 is a schematic diagram of a pressure detection circuit of a touch panel provided by an embodiment of the present disclosure.

FIG. 11 is a schematic diagram of a pressure detection circuit of a touch panel provided by an embodiment of the present disclosure. Referring to FIG. 11, this circuit is an example of the pressure detection circuit 150 described in FIG. 10. The circuit comprises an operational amplifier A1, a feedback capacitor Cfb, and an enable switch SW. A first input terminal of the operational amplifier A1 is connected to the touch electrode 131, and a second input terminal of the operational amplifier A1 is connected to the first detection electrode 110 and a first voltage terminal VSS (for example, a grounded terminal). A first terminal of the feedback capacitor Cfb is connected to the first input terminal of the operational amplifier A1, and a second terminal of the feedback capacitor Cfb is connected to an output terminal of the operational amplifier A1. A first terminal of the enable switch SW is connected to the first input terminal of the operational amplifier A1, and a second terminal of the enable switch SW is connected to the output terminal of the operational amplifier A1.

When an enable signal becomes valid, the enable switch SW is turned on (i.e., disconnected), and an output voltage Vout of the circuit is in direct proportion to the difference of charge amount between the touch electrode 131 and the first detection electrode 110. In a case where the touch electrode 131 and the first detection electrode 110 receive a certain external force, both of them generate polarization charges, and the difference of charge amount between the two electrodes changes. The circuit can perform high-gain amplification to the slight change in the charge amount and output it with the output voltage Vout, thereby implementing a touch pressure detection function. In a case where the enable signal becomes invalid, the enable switch SW is turned off (i.e., connected), and the output terminal of the operational amplifier A1 is connected to the first input terminal of the operational amplifier A1 to constitute a voltage follower, so that the touch pressure detection function is not implemented. The circuit implements the touch pressure detection function by way of charge amplification, has the advantages of high gain, stable performance and the like, and is not affected by the change of the length of the electrical wires, and the detection sensitivity is high.

Figure 12:
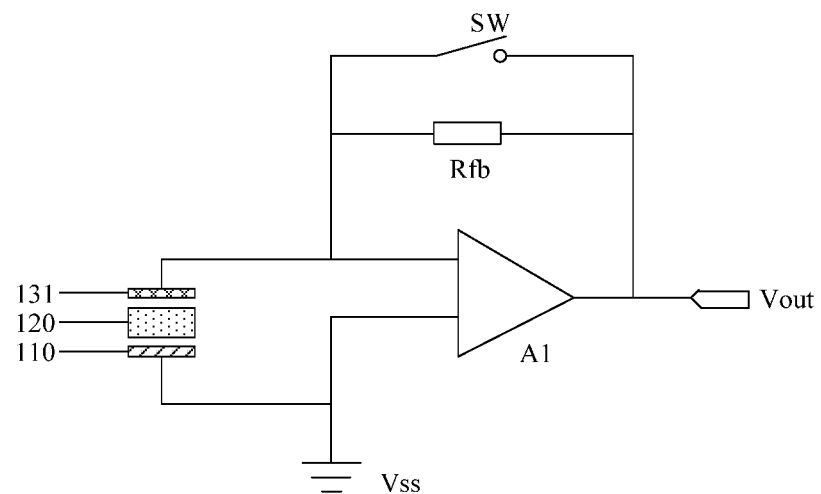
FIG. 12 is a schematic diagram of a pressure detection circuit of another touch panel provided by an embodiment of the present disclosure.

FIG. 12 is a schematic diagram of a pressure detection circuit of another touch panel provided by an embodiment of the present disclosure. Referring to FIG. 12, the pressure detection circuit is substantially the same as the pressure detection circuit illustrated in FIG. 11, except for a feedback resistor Rfb. In this embodiment, the circuit adopts a way of voltage amplification, that is, the feedback element is the feedback resistor Rfb, and the feedback capacitor Cfb is no longer used. A first terminal of the feedback resistor Rfb is connected to the first input terminal of the operational amplifier A1, and a second terminal of the feedback resistor Rfb is connected to the output terminal of the operational amplifier A1. In a case where the enable signal becomes valid, the enable switch SW is turned on (i.e., disconnected), and the output voltage Vout of the circuit is in direct proportion to the difference of voltage between the touch electrode 131 and the first detection electrode 110. The operating principle of the circuit is similar to that of the circuit illustrated in FIG. 11 and is not described again in details here. The circuit has the advantages of fast speed, low cost and the like.

It should be noted that, in the embodiments of the present disclosure, the pressure detection circuit 150 may comprise more or fewer components, and the circuit connection relationship between the components may be determined according to actual needs, which is not limited in the embodiments of the present disclosure. The pressure detection circuit 150 may be separately provided, or be integrated into circuits relevant to the touch position detection or other circuits of the touch panel.

At least one embodiment of the present disclosure further provides a touch device, which comprises the touch panel according to any one of the embodiments of the present disclosure. The touch device has a high integration level and cannot cause an increase in the thickness of the panel with more functions, the manufacturing process is simple, the production cost is low, and the detection accuracy is high.

Figure 13:
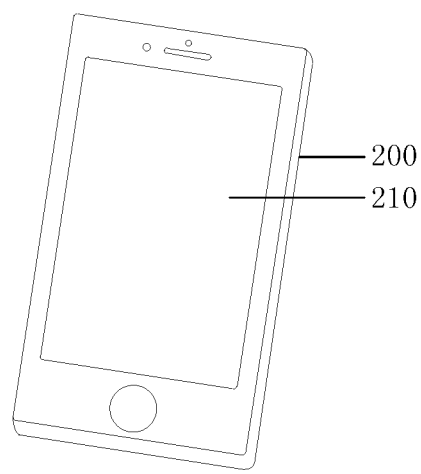
FIG. 13 is a schematic diagram of the appearance of a touch device provided by an embodiment of the present disclosure.

FIG. 13 is a schematic diagram of the appearance of a touch device provided by an embodiment of the present disclosure. Referring to FIG. 13, the touch device is a mobile phone 200 and comprises a touch panel 210. The touch panel 210 is the touch panel according to any one of the embodiments of the present disclosure. The mobile phone 200 not only has the function of touch position detection, but also has the function of touch pressure detection, thereby providing users with more operation options and a better usage experience. Certainly, the embodiments of the present disclosure are not limited thereto, and the touch device may also be any product or component having a touch function, such as an E-book, a tablet computer, a notebook computer, a game machine, a displayer, a digital photo frame, a navigator, and the like.

At least one embodiment of the present disclosure also provides a method of driving the touch panel according to any one of the embodiments of the present disclosure. The method comprises a touch position detection phase and a touch pressure detection phase. In the touch position detection phase, a touch scanning signal is applied to the touch electrode or the plurality of touch electrodes and a touch detection signal is collected, for implementing a position detection function. In the touch pressure detection phase, a pressure detection signal between the first detection electrode and the second detection electrode is collected for implementing a pressure detection function. The signal obtained by the pressure detection can be provided to an operating system. The operating system may utilize the signal to achieve desired functions, for example, providing a press (vibration) feedback of the strength corresponding to the magnitude of the pressure by obtaining the relative magnitude of the pressure through the obtained signals, or when the pressure exceeds a certain threshold, a menu being called out for the user to operate, or the like. The touch panel according to any one of the embodiments of the present disclosure can be driven by using the method, in which, the integration level is high, the panel thickness is not increased, the manufacturing process is simple, the production cost is low, and the detection accuracy is high.

Figure 14:
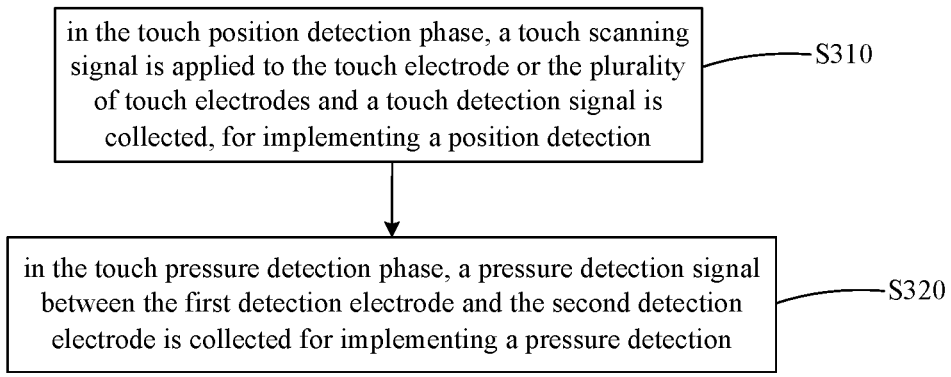
FIG. 14 is a flow chart of a method of driving a touch panel provided by an embodiment of the present disclosure.

FIG. 14 is a flow chart of a method of driving a touch panel provided by an embodiment of the present disclosure. Referring to FIG. 14, the method comprises a touch position detection phase and a touch pressure detection phase, and comprises the following steps:

Step S310: in the touch position detection phase, a touch scanning signal is applied to the touch electrode or the plurality of touch electrodes and a touch detection signal is collected, for implementing a position detection; and Step S320: in the touch pressure detection phase, a pressure detection signal between the first detection electrode and the second detection electrode is collected for implementing a pressure detection.

For example, the method adopts a time division detection mode, to alternately and repeatedly conduct the touch position detection and the touch pressure detection. For example, the touch detection signal and the pressure detection signal are time-divisionally transmitted through the same transmission channel, thereby avoiding mutual interference of signals and having higher detection accuracy. The pressure detection signal may be collected by way of charge amplification to achieve higher detection sensitivity and to be not affected by the change of the length of the electrical wires. Certainly, the embodiments of the present disclosure are not limited thereto, and the pressure detection signal may also be collected by way of voltage amplification or other suitable manner.

In one or more embodiments of the present disclosure, the touch detection signal and the pressure detection signal may be analyzed and calculated by a processor or an arithmetic circuit to obtain touch position information and pressure information. For example, the processor may be a universal processor or a dedicated processor, and may be a processor based on the X86 or ARM architecture, or the like. The touch detection signal and the pressure detection signal may be respectively analyzed and calculated, or may be analyzed and calculated in combination with each other, which is not limited in the embodiments of the present disclosure. For example, in an example, the touch detection signal and the pressure detection signal are respectively analyzed and calculated, thereby independently obtaining results such as the touch position information and the pressure information, which can simplify the analysis and calculation process and improve the processing efficiency. For example, in another example, the touch detection signal and the pressure detection signal are analyzed and calculated in combination with each other, so that multi-touch-pressure detection can be implemented, which can realize multi-finger pressure detection to provide a better user experience. The pressure information may comprise parameters such as the presence or absence of pressure and/or the magnitude of the pressure, which is not limited in the embodiment of the present disclosure.

It should be noted that, in the embodiments of the present disclosure, the method of driving the touch panel is not limited to the steps and the order described above and may comprise more or fewer steps, and the order between the steps may be determined according to actual needs.

Figure 15:
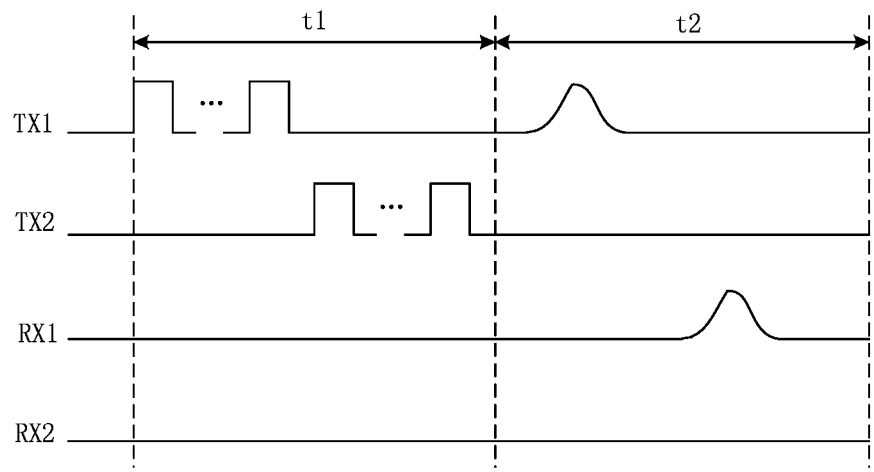
FIG. 15 is a timing diagram of driving a touch panel provided by an embodiment of the present disclosure.

FIG. 15 is a timing diagram of driving a touch panel provided by an embodiment of the present disclosure. For example, the touch panel comprises touch electrodes 131, and the touch electrodes 131 are the structure described in FIG. 2, that is, the touch electrodes 131 comprise a plurality of first touch electrodes 1311 and a plurality of second touch electrodes 1312, to form a touch scanning line and a touch sensing line, respectively.

Referring to FIG. 15, the driving timing comprises a touch position detection phase t1 and a touch pressure detection phase t2. In the touch position detection phase t1, touch scanning signals TX1 and TX2 are applied to the first touch electrodes 1311. TX1 and TX2 are signals applied to the first row of the first touch electrodes 1311 and the second row of the first touch electrodes 1311, respectively. Certainly, the embodiments of the present disclosure are not limited thereto, and the amount of the touch scanning signals may be any number, and is not limited to TX1 and TX2. Touch detection signals RX1 and RX2 of the second touch electrodes 1312 are also collected in the touch position detection phase t1. RX1 and RX2 are signals of the first column of the second touch electrodes 1312 and the second column of the second touch electrodes 1312, respectively. Certainly, the embodiments of the present disclosure are not limited thereto, and the amount of the touch detection signals may be any number, and is not limited to RX1 and RX2.

In the touch pressure detection phase t2, the first touch electrodes 1311 and the second touch electrodes 1312 are configured to function as the second detection electrode, and to synchronously receive pressure detection signals, that is, TX1, TX2, RX1, and RX2 are all pressure detection signals in this phase. For example, in an example, in the touch pressure detection phase t2, when both TX1 and RX1 detect a signal fluctuation, it can be determined that there is an external pressure at the intersection of the first row of the first touch electrodes 1311 and the first column of the second touch electrodes 1312.

It should be noted that, in the embodiments of the present disclosure, the driving timing of the touch panel is not limited to the manner described above, and may be any manner, which may be determined according to the structure, function, and use requirements of the touch panel.

The following is to be noted:

(1) The drawings of the present disclosure only relate to the structures relevant to the embodiments of the present disclosure, and other structures may be referred to the common design;

(2) In the case of no conflict, the embodiments of the present disclosure and the features of the embodiments may be combined with each other to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A touch panel, comprising:
a first detection electrode;
a piezoelectric material layer on the first detection electrode; and
a position touch structure, comprising a touch electrode or a plurality of touch electrodes and on the piezoelectric material layer;
wherein the touch electrode or at least one of the plurality of touch electrodes is configured to function as a second detection electrode as well, and the second detection electrode together with the piezoelectric material layer and the first detection electrode constitutes a piezoelectric sensing structure for implementing a touch pressure detection;
the touch panel further comprises a display structure, the display structure is configured to perform a display operation according to electrical signals applied to the display structure, and the piezoelectric sensing structure is on the display structure;
the display structure comprises an organic light emitting diode display array; and
the organic light emitting diode display array of the display structure comprises a common cathode, and the common cathode is configured to also function as the first detection electrode.

2. The touch panel according to claim 1, wherein a material of the piezoelectric material layer comprises a transparent piezoelectric material.

3. The touch panel according to claim 1, wherein the touch electrode or the at least one of the plurality of touch electrodes comprises at least one of a transparent conductive electrode or a grid-shaped metal electrode.

4. The touch panel according to claim 1, wherein the plurality of touch electrodes comprises a plurality of first touch electrodes and a plurality of second touch electrodes,
the plurality of first touch electrodes are configured to form a touch scanning line extending in a first direction, and
the plurality of second touch electrodes are configured to form a touch sensing line extending in a second direction intersecting with the first direction.

5. The touch panel according to claim 4, wherein the first touch electrodes and the second touch electrodes are in a same layer,
the position touch structure further comprises a plurality of bridge connection portions, the bridge connection portions are in a different layer from the first touch electrodes and the second touch electrodes,
the first touch electrodes or the second touch electrodes are connected in series through the bridge connection portions to form the touch scanning line or the touch sensing line, and
the first touch electrodes and the second touch electrodes are closer to the piezoelectric material layer than the bridge connection portions.

6. The touch panel according to claim 4, wherein the first touch electrodes and the second touch electrodes are in different layers.

7. The touch panel according to claim 1, wherein the plurality of touch electrodes are insulated from each other and in a same layer, and the plurality of touch electrodes are configured to be electrically connected to touch signal lines, correspondingly, to transmit touch signals.

8. The touch panel according to claim 1, wherein the display structure further comprises a thin film encapsulation layer, the thin film encapsulation layer is on the common cathode, and the piezoelectric material layer is on the thin film encapsulation layer.

9. The touch panel according to claim 1, further comprising a pressure detection circuit, wherein the pressure detection circuit is configured to collect a pressure detection signal between the first detection electrode and the second detection electrode by way of charge amplification when an enable signal is applied.

10. A touch device, comprising the touch panel according to claim 1.

11. A method of driving a touch panel, the touch panel comprising:
a first detection electrode;
a piezoelectric material layer on the first detection electrode; and
a position touch structure, comprising a touch electrode or a plurality of touch electrodes and on the piezoelectric material layer;
wherein the touch electrode or at least one of the plurality of touch electrodes is configured to function as a second detection electrode as well, and the second detection electrode together with the piezoelectric material layer and the first detection electrode constitutes a piezoelectric sensing structure for implementing a touch pressure detection;
the touch panel further comprises a display structure, the display structure is configured to perform a display operation according to electrical signals applied to the display structure, and the piezoelectric sensing structure is on the display structure;
the display structure comprises an organic light emitting diode display array;
the organic light emitting diode display array of the display structure comprises a common cathode, and the common cathode is configured to also function as the first detection electrode; and
the method comprises a touch position detection phase and a touch pressure detection phase,
wherein in the touch position detection phase, a touch scanning signal is applied to the touch electrode or the plurality of touch electrodes and a touch detection signal is collected, for implementing a position detection; and in the touch pressure detection phase, a pressure detection signal between the first detection electrode and the second detection electrode is collected for implementing a pressure detection.

12. The method according to claim 11, wherein in the touch pressure detection phase, the step that the pressure detection signal between the first detection electrode and the second detection electrode is collected for implementing the pressure detection further comprises:

the pressure detection signal is collected by way of charge amplification.

13. The method according to claim 11, wherein in the touch pressure detection phase, the step that the pressure detection signal between the first detection electrode and the second detection electrode is collected for implementing the pressure detection further comprises:

the pressure detection signal is processed combining with the touch detection signal for implementing a multi-touch-pressure detection.

* * * * *